(12) United States Patent
Fang et al.

(10) Patent No.: US 12,484,210 B2
(45) Date of Patent: Nov. 25, 2025

(54) SEMICONDUCTOR STRUCTURE AND METHOD FOR FORMING THE SAME

(71) Applicant: Fujian Jinhua Integrated Circuit Co., Ltd., Quanzhou (CN)

(72) Inventors: Xiaopei Fang, Quanzhou (CN); Gang-Yi Lin, Quanzhou (CN); Congcong Wang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 590 days.

(21) Appl. No.: 17/720,286

(22) Filed: Apr. 13, 2022

(65) Prior Publication Data

US 2023/0260905 A1 Aug. 17, 2023

(30) Foreign Application Priority Data

Feb. 17, 2022 (CN) .......................... 202210146219.7
Feb. 17, 2022 (CN) .......................... 202220323085.7

(51) Int. Cl.
*H10B 12/00* (2023.01)
*H01L 23/528* (2006.01)

(52) U.S. Cl.
CPC ......... *H10B 12/02* (2023.02); *H01L 23/5283* (2013.01); *H10B 12/30* (2023.02); *H10B 12/482* (2023.02)

(58) Field of Classification Search
CPC ............ H01L 21/7682; H01L 23/5283; H10B 12/033; H10B 12/0335; H10B 12/05; H10B 12/30; H10B 12/315; H10B 12/373; H10B 12/482; H10B 12/02; H10B 12/03; H10B 12/0383; H10B 12/0385; H10B 12/0387; H10B 12/053; H10B 12/056; H10B 12/09
See application file for complete search history.

(56) References Cited

U.S. PATENT DOCUMENTS

| | | | |
|---|---|---|---|
| 6,069,082 A | 5/2000 | Wong | |
| 6,251,786 B1 | 6/2001 | Zhou | |
| 6,258,707 B1 | 7/2001 | Uzoh | |
| 6,274,499 B1 | 8/2001 | Gupta | |
| 6,362,092 B1 | 3/2002 | Shieh | |
| 10,510,600 B1 * | 12/2019 | Hsu | H01L 21/0275 |
| 11,903,181 B2 | 2/2024 | Jhan | |
| 2015/0179651 A1 * | 6/2015 | Park | H10B 12/485 |
| | | | 257/296 |

FOREIGN PATENT DOCUMENTS

CN       104517959       4/2015

* cited by examiner

*Primary Examiner* — Britt D Hanley
*Assistant Examiner* — Kevin Quinto
(74) *Attorney, Agent, or Firm* — Winston Hsu

(57) ABSTRACT

A semiconductor structure includes a substrate, a first dielectric layer on the substrate, a second dielectric layer on the first dielectric layer, and an interconnection structure on the second dielectric layer. The interconnection structure includes at least two lateral extending portions on the second dielectric layer, and a U-shaped portion through the second dielectric layer and a portion of the first dielectric layer and connected between adjacent ends of the two lateral extending portions.

19 Claims, 13 Drawing Sheets

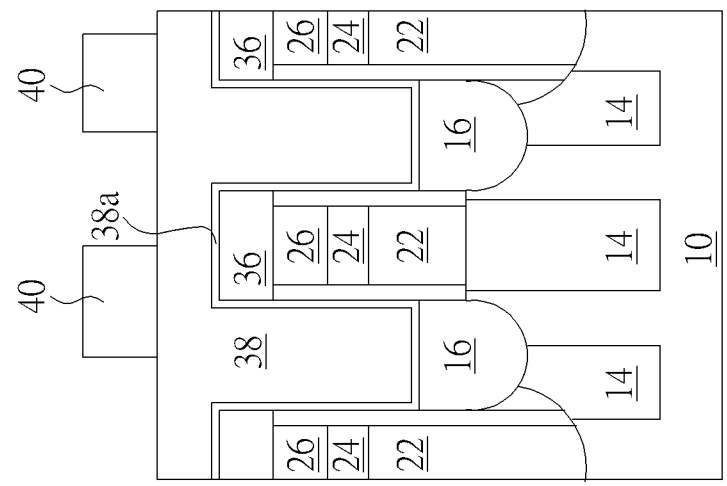
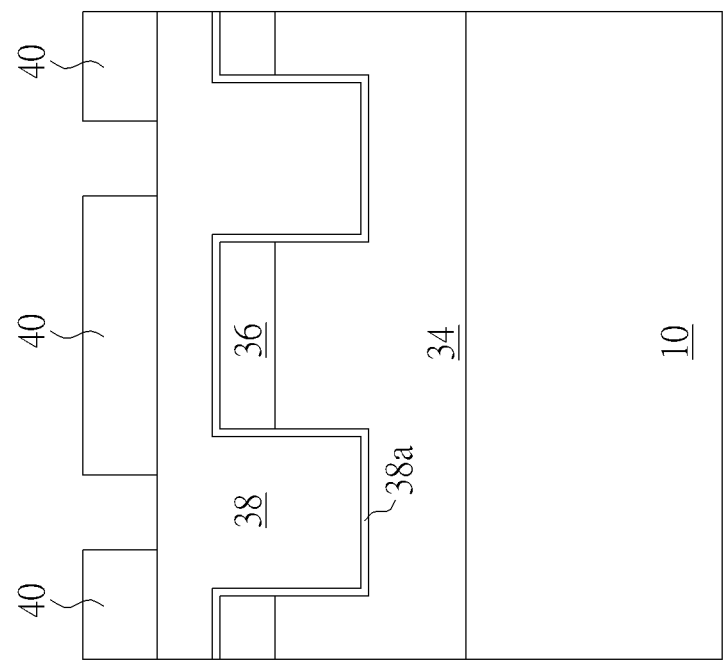
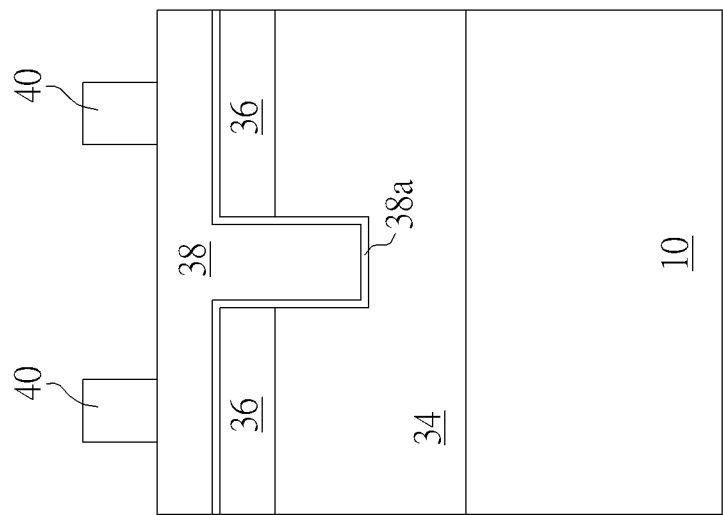
FIG. 7

SEMICONDUCTOR STRUCTURE AND METHOD FOR FORMING THE SAME

BACKGROUND OF THE INVENTION

1. Field of the Invention

The present invention generally relates to a semiconductor structure and a method for forming the same. More particularly, the present invention relates to a dynamic random access memory (DRAM) including a memory region and a peripheral region and a method for forming the same.

2. Description of the Prior Art

A dynamic random access memory (DRAM) is one kind of volatile memory. A DRAM usually includes memory region including a plurality of memory cells and a peripheral region including control circuits. The control circuits in the peripheral region may address each of the memory cells in the array region by plural columns of word lines and plural rows of bit lines traversing through the array region and electrically connected to each of the memory cells to perform reading, writing or erasing data. In advanced semiconductor manufacturing, the chip size of a DRAM device may be dramatically scaled down by adopting buried word-line or buried bit-lines architectures, by which the active areas of the memory cells may be arranged at a dense pitch for higher cell density.

The fabrication of a dynamic random access memory usually includes integrally forming structures of the memory region and the peripheral region through the same manufacturing processes. There is still a need in the field to optimize the manufacturing process and ensure the quality of the structures formed in the memory region and the peripheral region.

SUMMARY OF THE INVENTION

It is one objective of the present invention to provide a semiconductor structure and a method for forming the same. The semiconductor structure includes a memory region and a peripheral region, wherein an interconnection structure in the peripheral region is formed through the same process for forming the storage node contacts 44 in the memory region, and at least a bending portion of the layout pattern of the interconnection structure is realized by using a U-shaped portion to connect two lateral extending portions. The novel interconnection structure of the present invention may resolve the problems of line narrowing or line broken encountered in conventional interconnection structure.

One embodiment of the present invention provides a semiconductor structure includes a substrate, a first dielectric layer on the substrate, a second dielectric layer on the first dielectric layer, and an interconnection structure on the second dielectric layer, wherein the interconnection structure includes at least two lateral extending portions on the second dielectric layer, and a U-shaped portion through the second dielectric layer and a portion of the first dielectric layer and connected between adjacent ends of the two lateral extending portions.

Another embodiment of the present invention provides a method for forming a semiconductor structure including the steps of providing a substrate, forming a first dielectric layer on the substrate, forming a second dielectric layer on the first dielectric layer, forming at least a first opening through the second dielectric layer and a portion of the first dielectric layer, forming a conductive layer on the second dielectric layer and filling the first opening, and performing a recess process to the conductive layer to form an interconnection structure, wherein the interconnection structure includes at least two lateral extending portions on the second dielectric layer, and a U-shaped portion in the first opening and connected between adjacent ends of the two lateral extending portions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 11 are schematic diagrams illustrating the manufacturing steps for forming a semiconductor structure according to one embodiment of the present invention, wherein:

FIG. 1 shows a top plan view of the semiconductor structure after forming a first dielectric layer and a second dielectric layer on a substrate;

FIG. 2 shows cross-sectional views of the semiconductor structure along line AA', line BB' and line CC' as shown in FIG. 1;

FIG. 3 shows a top plan view of the semiconductor structure after forming a first opening and a second opening in the first dielectric layer and the second dielectric layer;

FIG. 4 shows cross-sectional views of the semiconductor structure along line AA', line BB' and line CC' as shown in FIG. 3;

FIG. 5 shows cross-sectional views of the semiconductor structure along line AA', line BB' and line CC' after forming a conductive layer on the second dielectric layer;

FIG. 6 shows a top plan view of the semiconductor structure after forming a mask layer on the conductive layer;

FIG. 7 shows cross-sectional views of the semiconductor structure along line AA', line BB' and line CC' as shown in FIG. 6;

FIG. 8 shows a top plan view of the semiconductor structure after a recess process to etch the conductive layer;

FIG. 9 shows cross-sectional views of the semiconductor structure along line AA', line BB' and line CC' as shown in FIG. 8;

FIG. 10 shows a top plan view of the semiconductor structure after forming a third dielectric layer on the conductive layer; and FIG. 11 shows cross-sectional views of the semiconductor structure along line AA', line BB' and line CC' as shown in FIG. 10.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification.

These embodiments are described in sufficient detail to enable those skilled in the art to practice the invention. Other embodiments may be utilized and that structural, logical and electrical changes may be made without departing from the spirit and scope of the present invention.

Figure 1:
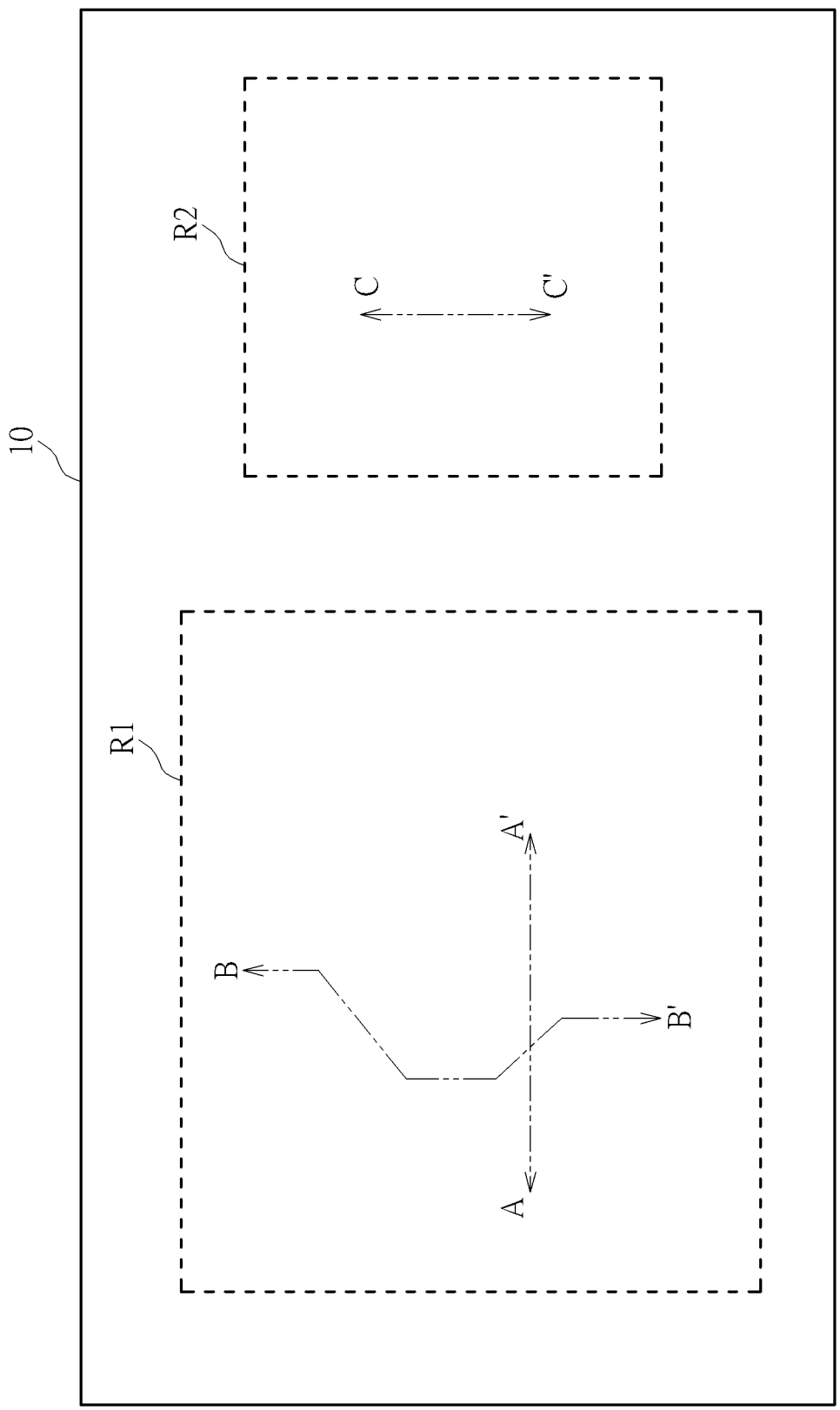

Please refer to FIG. 1 to FIG. 11, which are schematic diagrams illustrating the manufacturing steps for forming a semiconductor structure according to one embodiment of the present invention. As shown in FIG. 1, a substrate 10 including a peripheral region R1 and a memory region R2 defined thereon is provided. The peripheral region R1 may include peripheral circuits that control operations and input/out-put of the memory cells in the memory region R2, such as drivers, buffers, amplifiers, and decoders, but are not limited thereto. The memory region R2 may include an array of memory cells, such as a dynamic random access memory (DRAM) array. It should be noted that the shapes and arrangement of the peripheral region R1 and the memory region R2 are examples for illustration purpose and should not be taken as limitations to the present invention.

Figure 2:
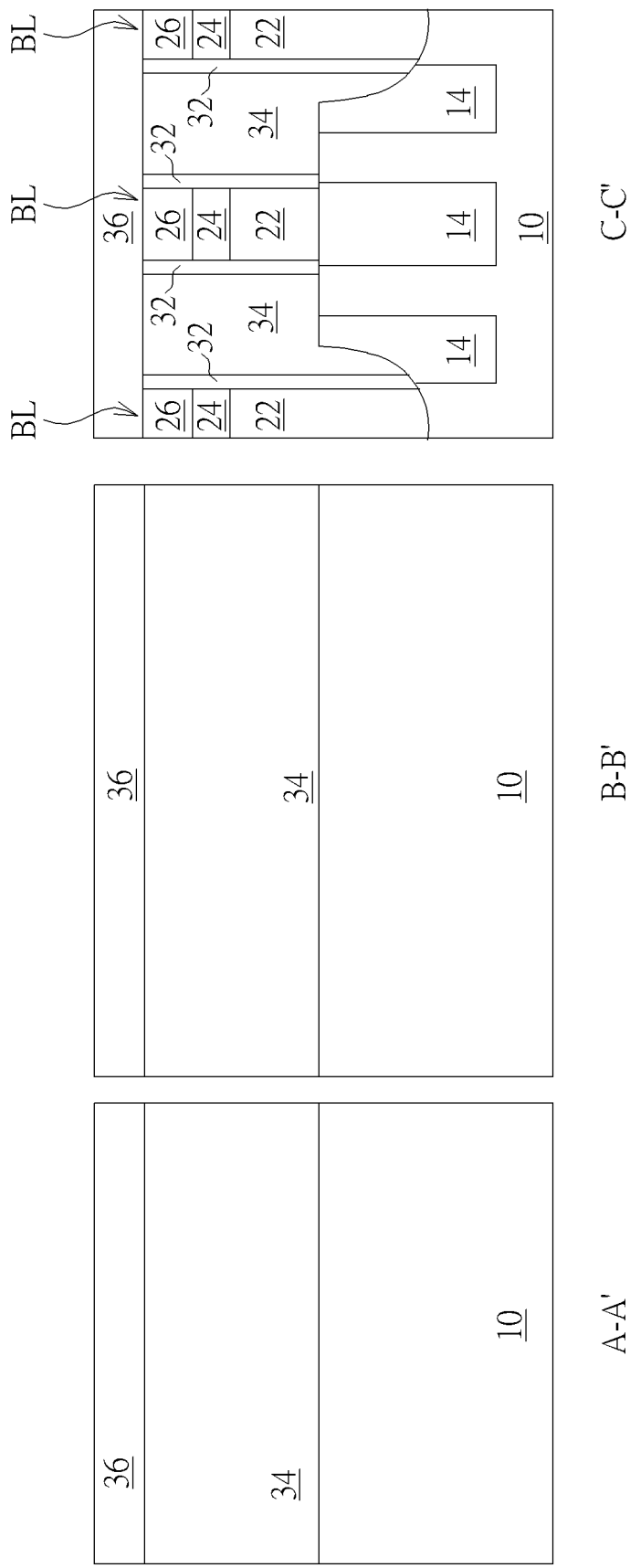

As shown in FIG. 2, the substrate 10 may be subject to suitable manufacturing processes to form components of the semiconductor structure on the peripheral region R1 and the memory region R2, such as the isolation structure 14 (the isolation structure 14 in the peripheral region R1 is omitted for simplicity), the bit lines BL on the memory region R2, the spacers 32 on sidewalls of the bit lines BL, the first dielectric layer 34 filling the spaces between the bit lines BL, and the second dielectric layer 36 on the first dielectric layer 34 and the bit lines BL. It should be understood that a plurality of buried word lines (not shown) may be formed in the memory region R2 of the substrate 10 and cut through the active regions of the memory cells to form buried gates of the memory cells.

The isolation structure 14 is formed in the substrate and may be shallow trench isolation (STI) structure used to define active regions (active regions of semiconductor devices or memory cells) in the peripheral region R1 and the memory region R2 of the substrate 10. The isolation structure 14 may include an dielectric material such as silicon oxide ($SiO_2$), silicon nitride (SiN), silicon oxynitride (SiON), silicon carbon nitride (SiCN), nitrogen doped silicon carbide (NDC), low dielectric constant (low-k) dielectric materials such as fluorinated silica glass (FSG), silicon oxycarbide (SiCOH), spin-on glass, porous low-k dielectric materials, organic polymer dielectric material, or a combination thereof, but is not limited thereto. The bit lines BL are disposed on the memory region R2 of the substrate 10 and overlap the active regions of the memory cells. As shown in FIG. 2, the bit lines BL respectively include a stack structure comprising, from the bottom to the top, a semiconductor layer 22, a metal layer 24, and a hard mask layer 26. The material of the semiconductor layer 22 may include single crystal silicon, polysilicon, amorphous silicon, or any suitable semiconductor material containing or not containing silicon. The material of the metal layer 24 may include aluminum (Al), tungsten (W), copper (Cu), titanium (Ti), titanium aluminum alloy (TiAl), and/or other suitable metal materials with low resistivity. The hard mask layer 26 may include a dielectric material, such as silicon nitride (SiN), silicon oxynitride (SiON), silicon carbon nitride (SiCN), or any suitable dielectric materials. In some embodiments, an interfacial layer (not shown) may be provided between the semiconductor layer 22 and the metal layer 24. The interfacial layer may be a single layer or a stack of layers made of titanium (Ti), tungsten silicide (WSi), tungsten nitride (WN), and/or other suitable metal silicides or metal nitride materials. The spacers 32 may include a single layer or multiple layers made of silicon nitride (SiN), silicon oxynitride (SiON), silicon carbon nitride (SiCN), and/or other suitable dielectric materials. The spacers 32 may protect the bit lines BL from damage during subsequent etching process and also electrically isolate the bit lines BL from the storage node contacts 44 (see FIG. 9). The first dielectric layer 34 covers the peripheral region R1 and the memory region R2 in a blanket manner and fills the spaces between the bit lines BL. The top surface of the first dielectric layer 34 may be planarized to be flush with the top surfaces of the bit lines BL. In the case shown in FIG. 2, the top surface of the bit line BL is the top surface of the hard mask layer 26. The second dielectric layer 36 covers the first dielectric layer 34 and the top surfaces of the bit lines BL. The second dielectric layer 36 may be used as an etching buffer layer during the recess process E1 (see FIG. 9) to protect underlying structures including the bit lines BL. The materials of the first dielectric layer 34 and the second dielectric layer 36 may include silicon oxide ($SiO_2$), silicon nitride (SiN), silicon oxynitride (SiON), silicon carbon nitride (SiCN), and/or other suitable dielectric materials. According to an embodiment of the present invention, the materials of the first dielectric layer 34 and the second dielectric layer 36 may be different. For example, the first dielectric layer 34 is made of silicon oxide ($SiO_2$), and the second dielectric layer 36 is made of silicon nitride (SiN), but is not limited thereto. The process to form the isolation structure 14, the bit lines BL, the spacers 32, the first dielectric layer 34 and the second dielectric layer 36 should be familiar to the skilled person in the art and would not be described in detail herein.

Figure 3:
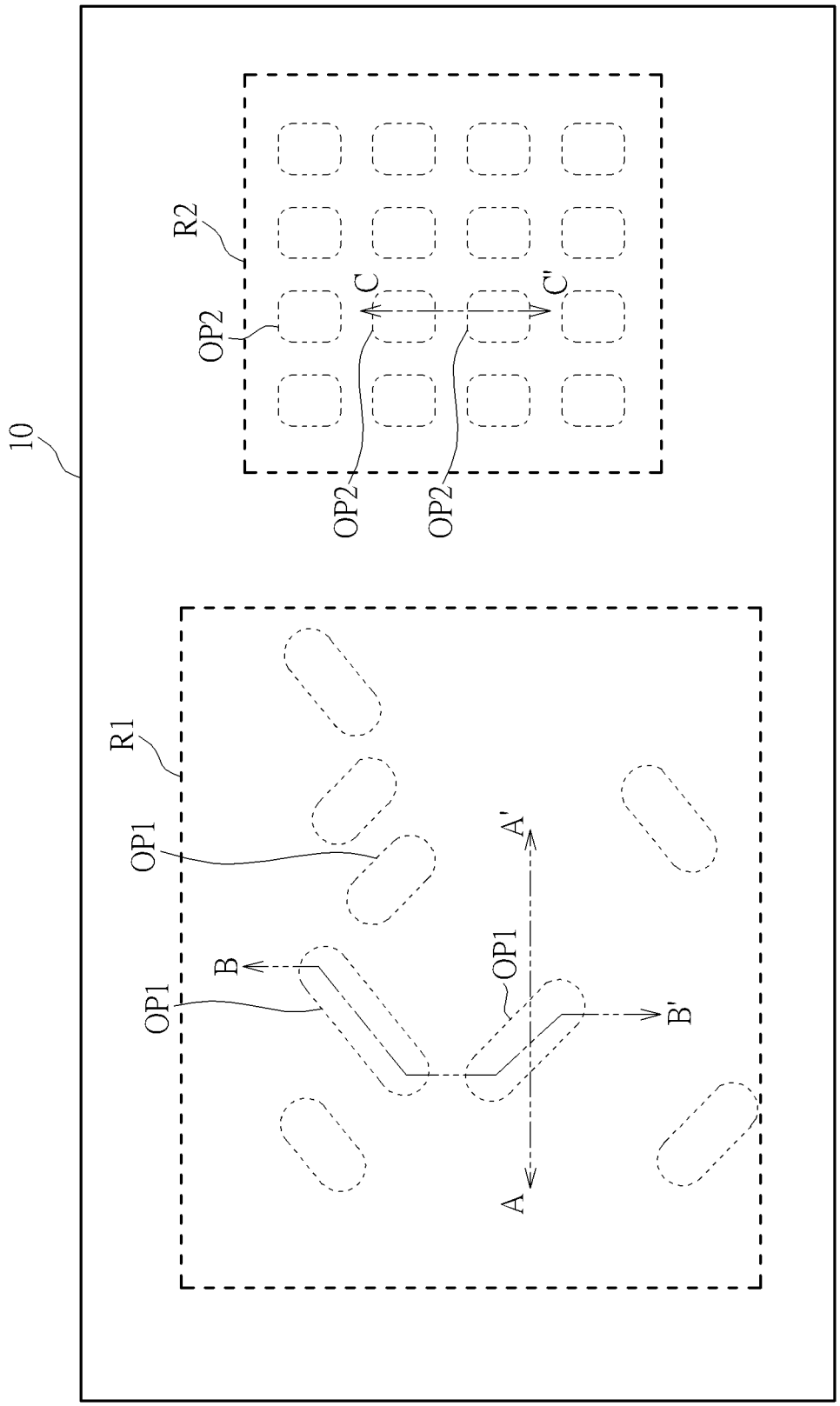
Figure 4:
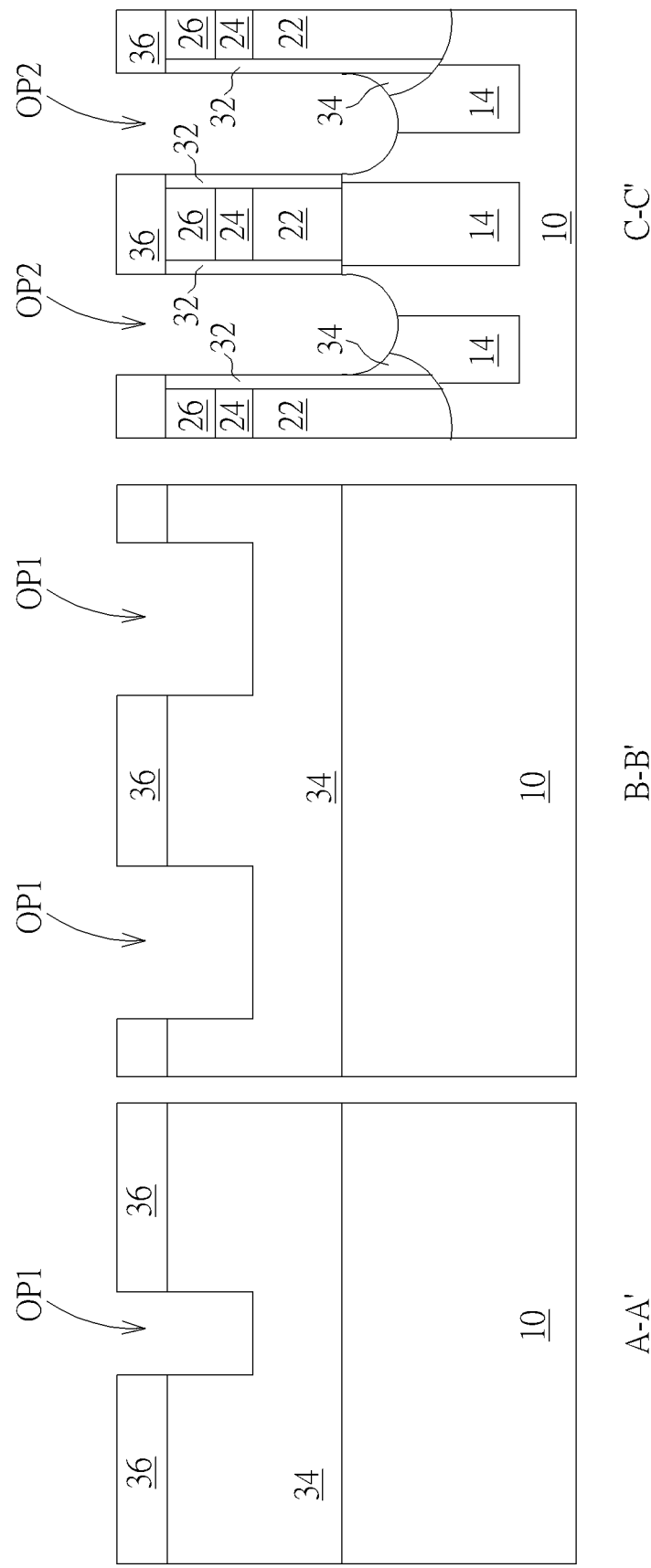

Subsequently, as shown in FIG. 3 and FIG. 4, one or more patterning processes (such as photolithography-etching processes) may be performed to form a plurality of first openings OP1 on the peripheral region R1 and a plurality of second openings OP2 on the memory region R2. The first openings OP1 respectively penetrate through the second dielectric layer 36 and extend into a portion of the first dielectric layer 34 without extending through the first dielectric layer 34. The arrangements of the first openings OP1 are designed according to the layout patterns of the interconnection structures 42 (see FIG. 8 and FIG. 9) and may be irregularly arranged corresponding to any portions of the interconnection structures 42. According to an embodiment of the present invention, the locations of the first openings OP1 are designed corresponding to the bending portions of the layout patterns of the interconnection structures 42. The first openings OP1 may have different dimensions and shapes in the top plan view. The second openings OP2 respectively penetrate through the second dielectric layer 36 and the first dielectric layer 34 between the bit lines BL to expose active regions (not shown) of the substrate 10. The arrangements of the second openings OP2 are designed according to the active regions of the memory cells and the storage node contacts 44 (see FIG. 9). In the top view as shown in the right portion of FIG. 3, the second openings OP2 are arranged in an array, and may have the same dimension and the same shape.

Figure 5:
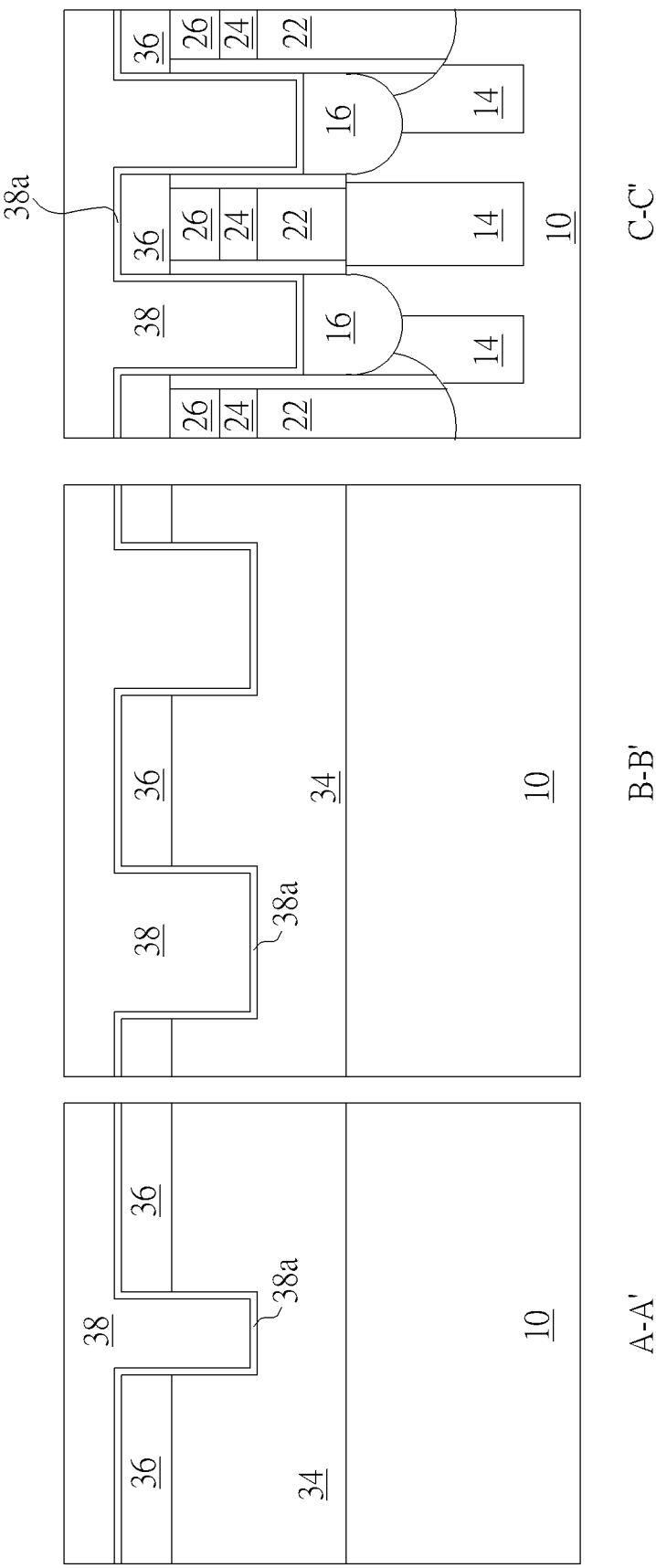

Following, as shown in FIG. 5, an epitaxial growth process or any suitable film deposition process may be performed to form semiconductor layers 16 in the bottom portions of the second openings OP2. Subsequently, a liner 38a may be formed along the surface of the second dielectric layer 36, the sidewalls and bottom surfaces of the first openings OP1, the sidewalls of the second openings OP2 and the top surfaces of the semiconductor layers 16. After that, a conductive layer 38 is formed on the liner 38a and fills the first openings OP1 and the second opening OP2. The liner 38a and the conductive layer 38 may be made by any suitable film deposition process, such as chemical vapor deposition (CVD) process, physical vapor deposition (PVD) process, or atomic layer deposition (ALD) process, but is not limited thereto.

As shown in FIG. 5, the semiconductor layer 16 is in direct contact with the substrate 10. The material of the semiconductor layer 16 may include single crystal silicon, polysilicon, or phosphorous doped silicon, but is not limited thereto. In some embodiments of the present invention, the contacting area of the semiconductor layer 16 and the substrate 10 may be enlarged by etching and recessing the exposed portions of the substrate 10 through the second openings OP2. The materials of the liner 38a and the conductive layer 38 may include metals, metal compounds, or metal alloys. For example, the liner 38a may include titanium (Ti), titanium nitride (TiN), tantalum (Ta), tantalum nitride (TaN), titanium tungsten (Ti/W), or a combination thereof, but is not limited thereto. The conductive layer 38 may include aluminum (Al), tungsten (W), copper (Cu), titanium aluminum alloy (TiAl), or a combination thereof, but is not limited thereto. According to an embodiment of the present invention, the liner 38a includes titanium nitride (TiN), and the conductive layer 38 includes tungsten (W). Optionally, a metal silicide layer (not shown) may be formed between the liner 38a and the semiconductor layer 16. The material of the metal silicide layer may include titanium silicide (TiSix), tungsten silicide (WSix), tantalum silicide (TaSix), molybdenum silicide (MoSix), cobalt silicide (CoSix), nickel silicide (NiSix), or a combination thereof, but is not limited thereto. A planarization process (such as an etch-back process and/or a chemical mechanical polishing process) may be performed to remove unnecessary portions of the conductive layer 38 until the conductive layer 38 on the peripheral region R1 and the memory region R2 have a pre-determined thickness and a planar surface.

Figure 6:
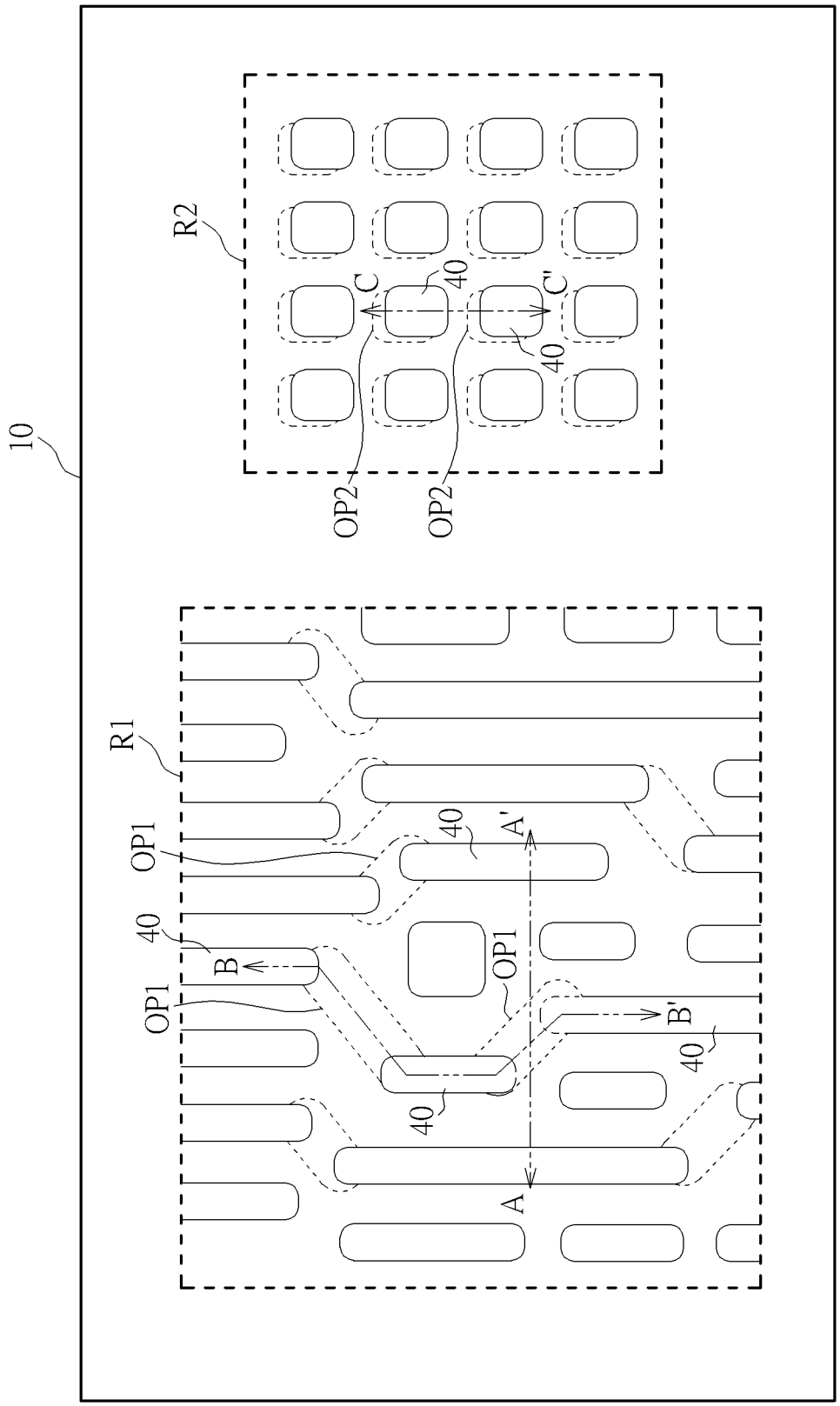

Subsequently, as shown in FIG. 6 and FIG. 7, a mask material layer (such as a dielectric layer or a photoresist layer) may be formed to cover the conductive layer 38 on the peripheral region R1 and the memory region R2. A patterning process such as an exposure-development process or an etching process may be performed on the mask material layer to form a patterned mask layer 40 that partially exposes the conductive layer 38. As shown in the left portion of FIG. 6, the mask layer 40 on the peripheral region R1 includes a plurality of discontinued linear patterns that may be irregularly arranged according to the layout patterns of the interconnection structures 42 (see FIG. 8 and FIG. 9) and may have different lengths, widths, and shapes. According to a preferred embodiment of the present invention, all of the linear patterns of the mask layer 40 are straight lines without any bending. It is noteworthy that, in the top view, the first openings OP1 are located between the ends of two adjacent linear patterns of the mask layer 40, and are partially overlapped with the ends of the linear patterns along the vertical direction. As shown in the right portion of FIG. 6, the mask layer 40 on the memory region R2 may include a plurality of island patterns that are arranged corresponding to the second openings OP2. The island patterns may have the same dimension and the same shape, and may be respectively displaced from the corresponding second openings OP2 and partially overlapped with the second openings OP2.

Figure 8:
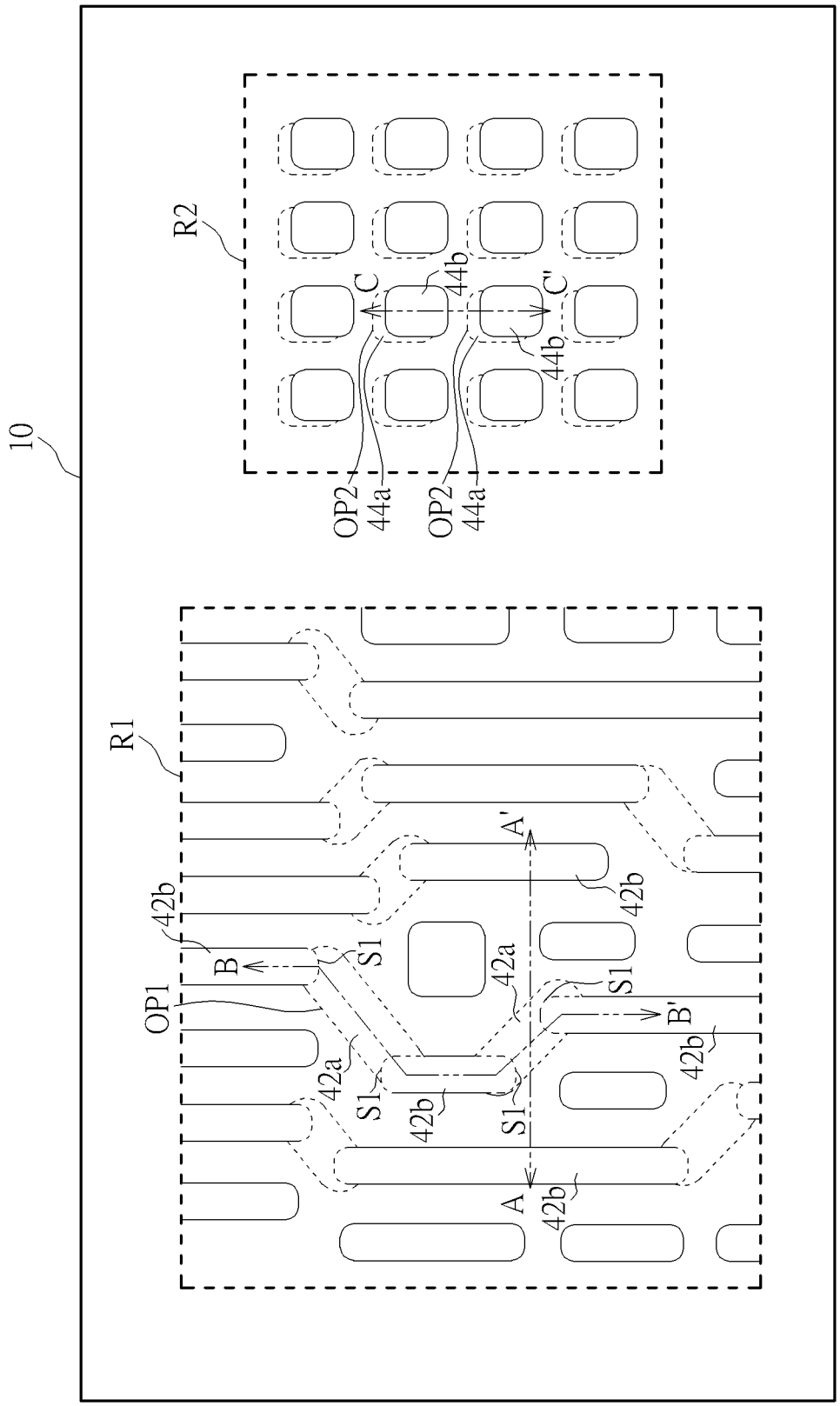
Figure 9:
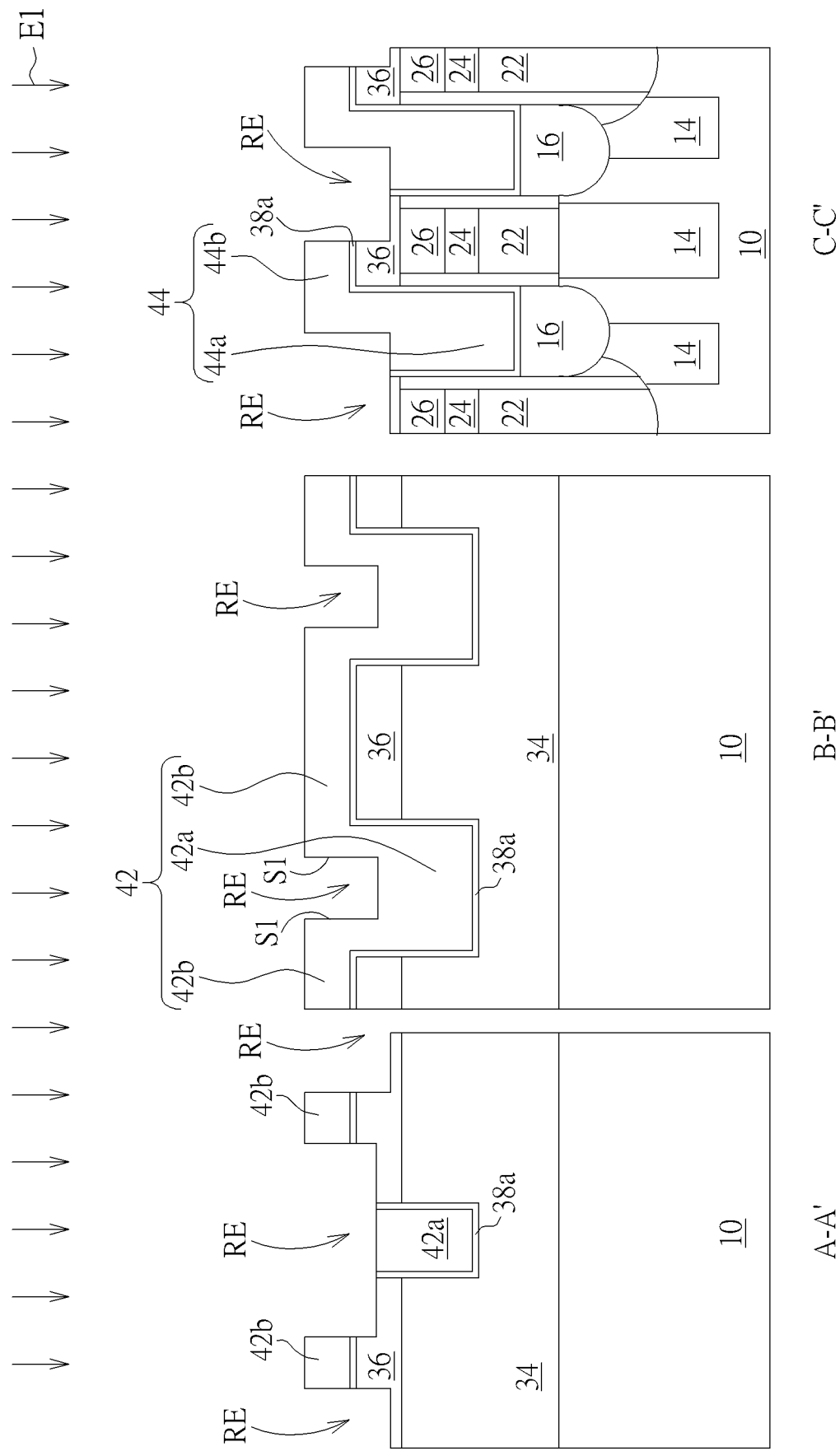

Subsequently, as shown in FIG. 8 and FIG. 9, a recess process E1 (such as a dry etching process) may be performed, using the mask layer 40 as an etching mask to etch and remove the exposed portions of the conductive layer 38, the liner 38a and the second dielectric layer 36, thereby forming recesses RE through the conductive layer 38, the liner 38a, and a portion of the second dielectric layer 36 to pattern the conductive layer 38 to form a plurality of interconnection structures 42 on the peripheral region R1 and a plurality of storage node contacts 44 on the memory region R2. The recesses RE on the peripheral region R1 and the memory region R2 may have the same or different depths, depending on the pattern density and/or control of the recess process E1.

Please refer to the left portion of FIG. 8 and the left and middle portions of FIG. 9. The middle portion of FIG. 9 shows a cross-sectional view of an interconnection structure 42 along the line BB', wherein the line BB' is along the layout pattern of the interconnection structure 42 as shown in FIG. 8. The left portion of FIG. 9 shows a cross-sectional view of a U-shaped portion 42a of the interconnection structure 42 along the line AA'. The interconnection structure 42 includes at least a U-shaped portion 42a and two lateral extending portions 42b that are integrally made in one-piece. The lateral extending portions 42b are disposed directly above the second dielectric layer 36 and are made by transferring the linear patterns of the mask layer 40 to the conductive layer 38. The lateral extending portions 42b are the majority of the interconnect structure 42. According to a preferred embodiment of the present invention, all of the lateral extending portions 42b are straight lines without any bending. The U-shaped portion 42a is made by the conductive layer 38 in the first opening OP1 and is through the second dielectric layer 36 and a portion of the first dielectric layer 34.

The location of the U-shaped portion 42a is determined by the first opening OP1 and may be disposed in any portion of the interconnection structures 42. In this embodiment, the U-shaped portion 42a is disposed in a bending portion of the layout pattern of the interconnection structure 42, and is used as a connecting piece connected between adjacent ends S1 of two staggered lateral extending portions 42b, wherein the end S1 of the lateral extending portion 42b connected at one side of the U-shaped portion 42a is not on the straight line along the length of the other lateral extending portion 42b connected at the other side of the U-shaped portion 42a. In other words, the straight line through the ends S1 connected by the U-shaped portion 42a and the straight line along the length of any one of the two lateral extending portions 42b are not parallel.

Please refer to the right portion of FIG. 8 and the right portion of FIG. 9. The right portion of FIG. 9 shows a cross-sectional view of the storage node contacts 44 along the line CC' as shown in FIG. 8. The storage node contacts 44 respectively include a plug portion 44a and a contact pad portion 44b on the plug portion 44a. The plug portion 44a and the contact pad portion 44b are integrally made in one-piece, wherein the plug portion 44a is formed by the conductive layer 38 in the second opening OP2, and the contact pad portion 44b is made by transferring the island pattern of the mask layer 40 to the conductive layer 38. In this embodiment, the plug portion 44a and the contact pad portion 44b include an offset and are partially overlapped along the vertical direction.

Figure 10:
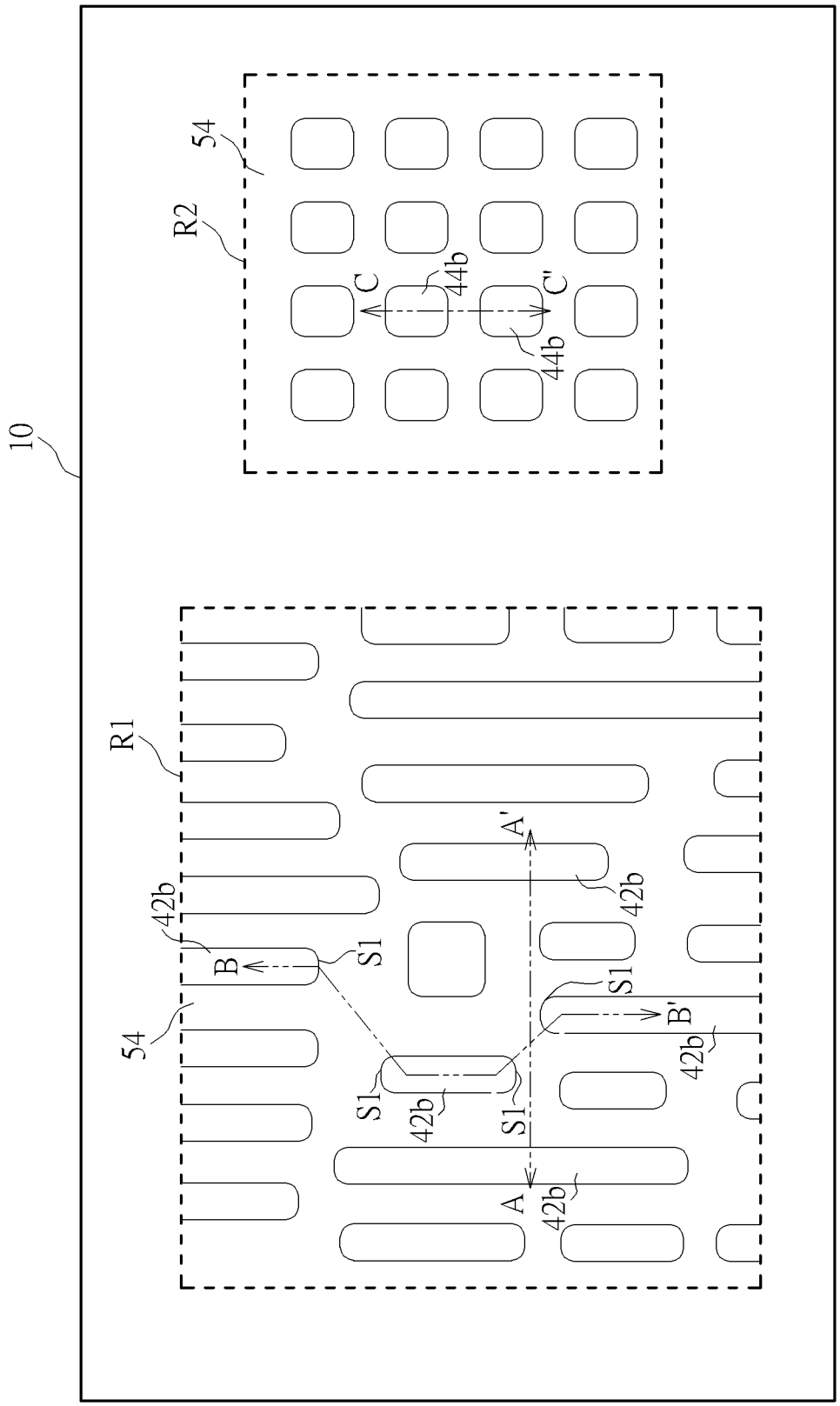
Figure 11:
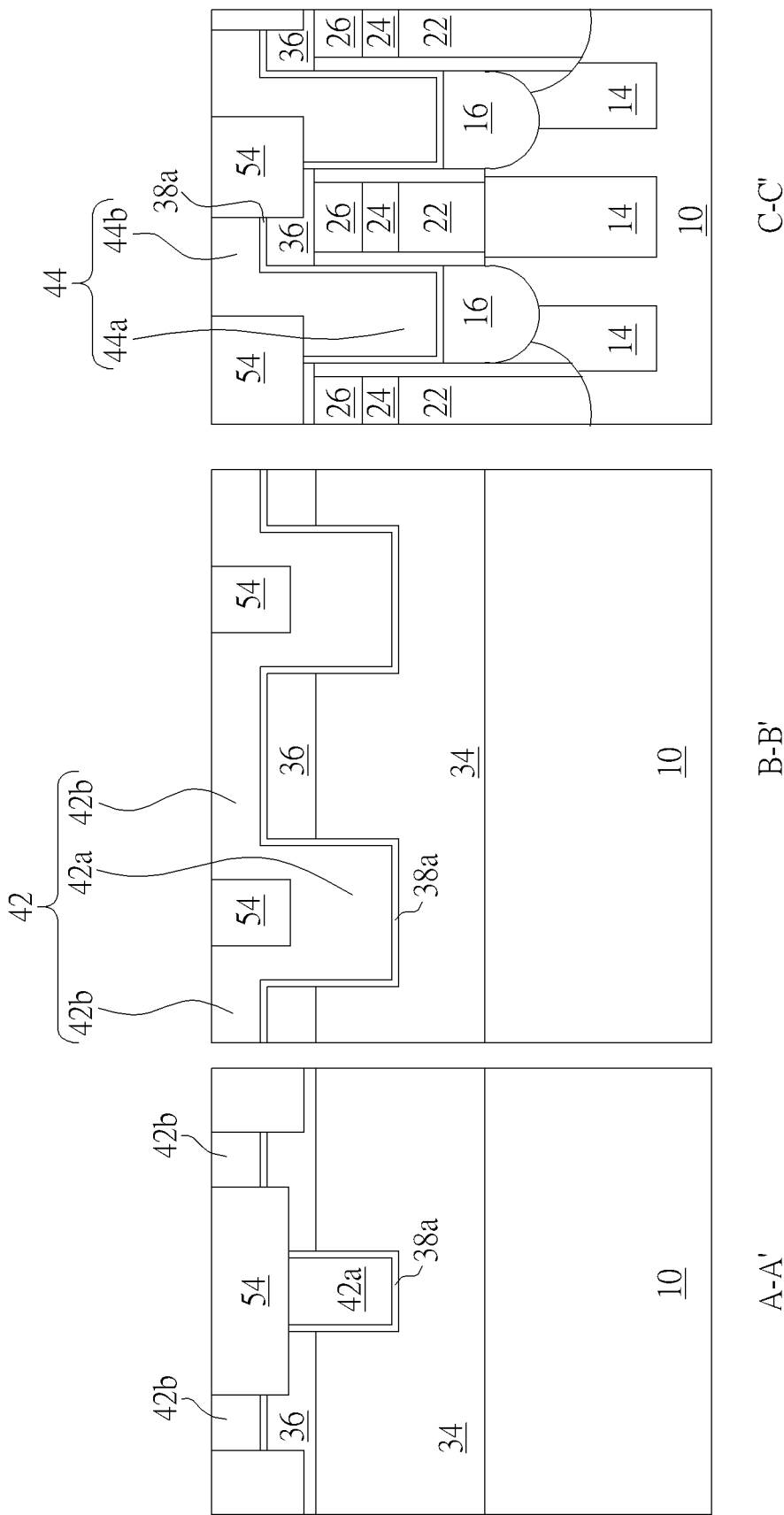

Subsequently, as shown in FIG. 10 and FIG. 11, a film deposition process (such as chemical vapor deposition process, physical vapor deposition process, or atomic layer deposition process) may be performed to form a third dielectric layer 54 on the second dielectric layer 36 to fill the recesses RE between the interconnection structures 42 and the storage node contacts 44. The material of the third dielectric layer 54 may include silicon oxide ($SiO_2$), silicon nitride (SiN), silicon oxynitride (SiON), silicon carbon nitride (SiCN), nitrogen doped silicon carbide (NDC), low dielectric constant (low-k) dielectric materials such as fluorinated silica glass (FSG), silicon oxycarbide (SiCOH), spin-on glass, porous low-k dielectric materials, organic polymer dielectric material, or a combination thereof, but is not limited thereto. According to an embodiment of the present invention, the third dielectric layer 54 may include silicon nitride (SiN). Following, a planarization process (such as an etch-back process and/or a chemical mechanical polishing process) may be performed to remove the portion of the third dielectric layer 54 outside the recesses RE until the top surfaces of the interconnection structures 42 and the storage node contacts 44 are exposed. It is noteworthy that after the planarization process, as shown in FIG. 10, only the top surface of the lateral extending portion 42b of the interconnect structure 42 and the top surface of the contact pad portion 44b of the storage node contact 44 are exposed from the surface of the third dielectric layer 54. The top surface of the U-shaped portions 42a is covered by the third dielectric layer 54 and is not exposed. The ends S1 of the lateral extending portions 42b that are connected at two sides of the U-shaped portions 42a are surrounded by the third dielectric layer 54. As shown in FIG. 11, the third dielectric layer 54 filled in the recesses RE is in direct contact with sidewalls of lateral extending portions 42b and top surfaces of the U-shaped portions 42a.

Figure 12:
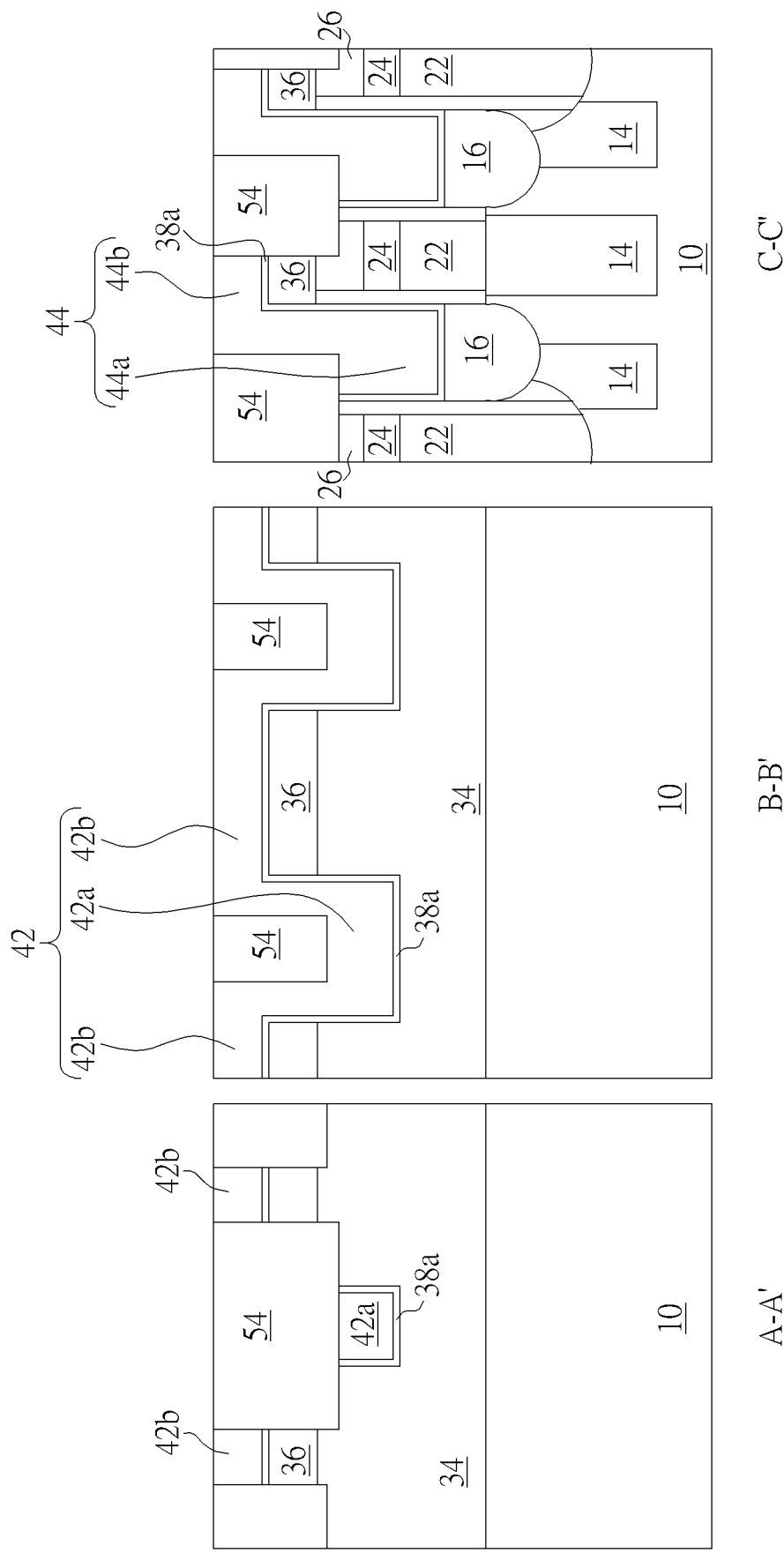
FIG. 12 is a schematic diagram illustrating a variant of the semiconductor structure shown in FIG. 11.

Please refer to FIG. 12, which shows a variant of the semiconductor structure shown in FIG. 11. By controlling the recess process E1 (see FIG. 9), the recesses RE may have deeper depths. As shown in FIG. 12, the recesses RE on the peripheral region R1 may penetrate through the conductive layer 38, the liner 38a, and the second dielectric layer 36 and extend into a portion of the first dielectric layer 34. The recesses RE on the memory region R1 may penetrate through the conductive layer 38, the liner 38a, and the second dielectric layer 36 and extend into a portion of the hard mask layer 26 of the bit lines BL. Accordingly, the bottom surface of the third dielectric layer 54 in the recesses RE would be lower than the bottom surface of the second dielectric layer 36. In some embodiments, due to pattern density difference and/or control of the recess process E1, the depths of the recesses RE on different regions of the substrate 10 may have a distinguishable difference.

Figure 13:
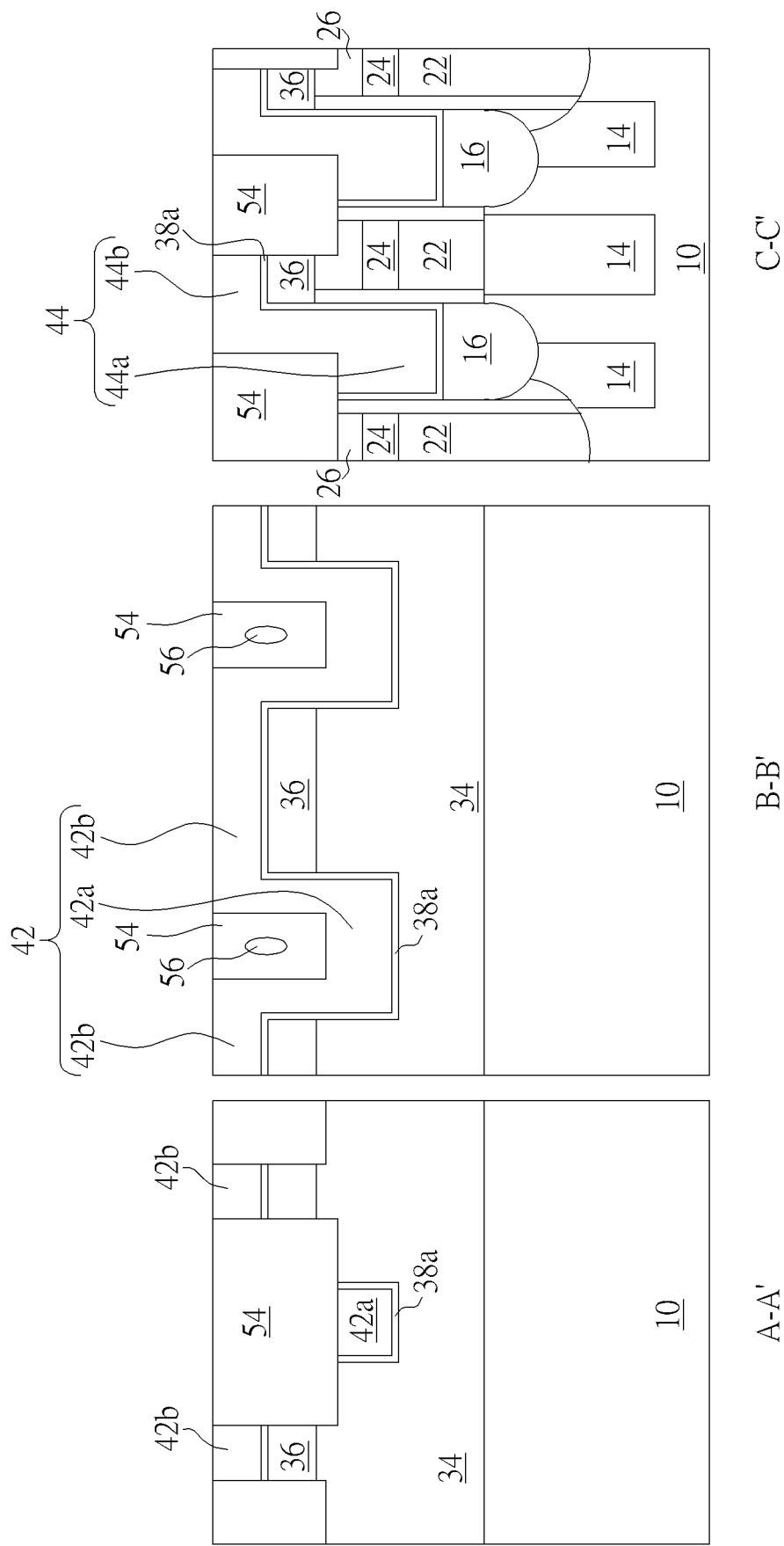
FIG. 13 is a schematic diagram illustrating another variant of the semiconductor structure shown in FIG. 11.

Please refer to FIG. 13, which shows another variant of the semiconductor structure shown in FIG. 11. In some embodiments when the recesses RE are deeper or have a larger aspect ratio, the third dielectric layer 54 may partially fill the recess RE of the U-shaped portion 42a and seal a void 56 in the recess RE. In some embodiments, the void 56 may be surrounded by both the third dielectric layer 54 and the U-shaped portion 42a (the void is in contact with the third dielectric layer 54 and the U-shaped portion 42a).

In conventional technology, an interconnection structure is usually formed by defining the whole layout pattern (including straight line portions and bending line portions) of the interconnection structure in a mask layer and then using the mask layer as an etching mask to etch and pattern a conductive layer to form the interconnection structure in the conductive layer. However, as the dimension of the interconnection structure gradually shrinks, it has become more and more difficult to produce ideal layout pattern in the mask layer. For example, pattern deformations are likely to occur at some critical bending portions of the layout pattern defined in the mask layer, which may lead to line narrowing or line broken defects in the resulting interconnection structure. The present invention uses the U-shaped portion 42a as a connecting piece to connect the lateral extending portions 42b to realize a bending layout pattern of the interconnection structure 42, so that there is no need to define the bending line portions in the mask layer 40, and a larger process window may be obtained because most of the patterns defined in the mask layer are straight lines. In this way, the problems of line narrowing or line broken encountered in conventional technology may be resolved, and the quality of the interconnection structure 42 may be ensured. Furthermore, in some embodiments of the present invention some of the first openings OP1 may extend through the first dielectric layer 34 to expose the active regions of the substrate 10, In the case, the U-shaped portions 42a formed in the first openings OP1 may be in direct contact with the active regions and electrically connected to the active regions. The U-shaped portions 42a may be used to electrically connect the lateral extending portions 42b and also electrically connect the lateral extending portions 42b and the active regions of the substrate 10.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   a first dielectric layer on the substrate;
   a second dielectric layer on the first dielectric layer;
   an interconnection structure on the second dielectric layer, wherein the interconnection structure comprises:
   at least two lateral extending portions on the second dielectric layer; and
   a U-shaped portion through the second dielectric layer and a portion of the first dielectric layer and connected between adjacent ends of the two lateral extending portions; and
   a third dielectric layer on the second dielectric layer and filling a recess of the U-shaped portion of the interconnection structure.

2. The semiconductor structure according to claim 1, wherein the two lateral extending portions and the U-shaped portion of the interconnection structure are of a one-piece structure.

3. The semiconductor structure according to claim 1, further comprising a liner disposed between the interconnection structure and the first dielectric layer and the second dielectric layer.

4. The semiconductor structure according to claim 1, wherein a top surface of the third dielectric layer is flush with top surfaces of the two lateral extending portions.

5. The semiconductor structure according to claim 1, wherein a void is sealed in the recess of the U-shaped portion by the third dielectric layer.

6. The semiconductor structure according to claim 1, wherein a bottom surface of the third dielectric layer is lower than bottom surfaces of the two lateral extending portions.

7. The semiconductor structure according to claim 1, wherein the third dielectric layer is in direct contact with sidewalls of the two lateral extending portions and a top surface of the U-shaped portion.

8. The semiconductor structure according to claim 1, wherein adjacent ends of the two lateral extending portions are surrounded by the third dielectric layer in a top plan view.

9. The semiconductor structure according to claim 1, wherein a straight line connecting the adjacent ends of the two lateral extending portions and another straight line along a length direction of any one of the two lateral extending portions are not parallel.

10. A method for forming a semiconductor structure, comprising:
   providing a substrate;
   forming a first dielectric layer on the substrate;
   forming a second dielectric layer on the first dielectric layer;
   forming at least a first opening through the second dielectric layer and a portion of the first dielectric layer;
   forming a conductive layer on the second dielectric layer and filling the first opening;
   performing a recess process to the conductive layer to form an interconnection structure, wherein the interconnection structure comprises:
      at least two lateral extending portions on the second dielectric layer; and
      a U-shaped portion in the first opening and connected between adjacent ends of the two lateral extending portions; and
   forming a third dielectric layer on the second dielectric layer and filling into a recess of the U-shaped portion.

11. The method for forming a semiconductor structure according to claim 10, wherein the two lateral extending portions and the U-shaped portion of the interconnection structure are of a one-piece structure.

12. The method for forming a semiconductor structure according to claim 10, further comprising:
   forming a liner along a surface of the second dielectric layer and a sidewall and a bottom surface of the first opening; and
   forming the conductive layer on the liner.

13. The method for forming a semiconductor structure according to claim 10, further comprising:
   removing a portion of the third dielectric layer until top surfaces of the two lateral extending portions are exposed.

14. The method for forming a semiconductor structure according to claim 10, wherein a bottom surface of the third dielectric layer is lower than bottom surfaces of the two lateral extending portions.

15. The method for forming a semiconductor structure according to claim 10, wherein the third dielectric layer is in direct contact with sidewalls of the two lateral extending portions and a top surface of the U-shaped portion.

16. The method for forming a semiconductor structure according to claim 10, wherein the third dielectric layer seals a void in the recess of the U-shaped portion.

17. The method for forming a semiconductor structure according to claim 10, wherein adjacent ends of the two lateral extending portions are surrounded by the third dielectric layer in a top plan view.

18. The method for forming a semiconductor structure according to claim 10, wherein a straight line connecting the adjacent ends of the two lateral extending portions and another straight line along a length direction of any one of the two lateral extending portions are not parallel.

19. The method for forming a semiconductor structure according to claim 10, further comprising:
   forming a plurality of bit lines on the substrate;
   forming the first dielectric layer to fill spaces between the bit lines;
   forming the second dielectric layer on the first dielectric layer and the bit lines;
   forming a plurality of second openings through the second dielectric layer and the first dielectric layer between the bit lines;
   forming the conductive layer on the bit lines and filling the second openings; and
   performing the recess process to the conductive layer to form a plurality of storage node contacts, wherein the storage node contacts respectively comprise:
      a plug portion disposed in one of the second opening; and
      a contact pad portion on the plug portion, wherein a top surface of the contact pad portion is flush with top surfaces of the two lateral extending portions.

* * * * *